(12) United States Patent
Chiou et al.

(10) Patent No.: US 10,089,182 B2
(45) Date of Patent: Oct. 2, 2018

(54) ENERGY-EFFICIENT NONVOLATILE MICROPROCESSOR

(71) Applicant: National Cheng Kung University, Tainan (TW)

(72) Inventors: Lih-Yih Chiou, Tainan (TW); Tsai-Kan Chien, Tainan (TW); Chang-Chia Lee, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 184 days.

(21) Appl. No.: 15/161,368

(22) Filed: May 23, 2016

(65) Prior Publication Data

US 2016/0364298 A1 Dec. 15, 2016

(30) Foreign Application Priority Data

Jun. 10, 2015 (TW) .............................. 104118737 A

(51) Int. Cl.
*G06F 11/00* (2006.01)
*G06F 11/14* (2006.01)
(Continued)

(52) U.S. Cl.
CPC ........ *G06F 11/1441* (2013.01); *G06F 11/167* (2013.01); *G06F 11/3062* (2013.01);
(Continued)

(58) Field of Classification Search
CPC ............. G06F 12/0238; G06F 11/1441; G06F 11/1446; G06F 11/1458; G06F 11/1469;
(Continued)

(56) References Cited

U.S. PATENT DOCUMENTS 6,157,979 A * 12/2000 Barnett .................. G06F 13/16
365/145
7,639,056 B2 * 12/2009 Gururajarao ..... H03K 3/356008
327/202

(Continued)

OTHER PUBLICATIONS

Wang, Yiqun et al., A Compression-based Area-efficient Recovery Architecture for Nonvolatile Processors, IEEE, Mar. 2012 (Year : 2012).*

(Continued)

*Primary Examiner* — Marc Duncan
(74) *Attorney, Agent, or Firm* — Bacon & Thomas, PLLC

(57) ABSTRACT

An energy-efficient nonvolatile microprocessor includes a processing core, a nonvolatile flip-flop array, a set of nonvolatile interconnections, and a store-enable register. When a power source is recovered to a stable state, the processing core determines whether data of nonvolatile registers is not transmitted before power-off. If yes, the processing core executes programmable recovery entry decision to avoid recovery failures for different applications. The processing core has plural system states divided into programmer visible states and programmer invisible states. The nonvolatile interconnections are connected between the processing core and the nonvolatile flip-flop array. When the power source is unstable, the processing core only stores the programmer visible states into the nonvolatile flip-flop array and, at the same time, only stores the system states of the peripheral modules corresponding to the bits of the store-enable register that are set to be "true" into the nonvolatile flip-flop array.

14 Claims, 14 Drawing Sheets

(51) Int. Cl.
G06F 11/16 (2006.01)
G06F 11/30 (2006.01)
G06F 12/02 (2006.01)
G11C 16/34 (2006.01)
G11C 16/20 (2006.01)
G11C 16/30 (2006.01)

(52) U.S. Cl.
CPC .......... *G06F 12/0238* (2013.01); *G11C 16/20* (2013.01); *G11C 16/3404* (2013.01); *G06F 2212/202* (2013.01); *G11C 16/30* (2013.01)

(58) Field of Classification Search
CPC ............... G06F 11/1402; G06F 11/167; G06F 11/1451; G06F 1/30; G06F 1/305; G11C 16/3404; G11C 16/30; G11C 16/20
See application file for complete search history.

(56) References Cited

U.S. PATENT DOCUMENTS

| 9,830,964 B2* | 11/2017 | Bartling | G11C 7/22 |
| 2014/0075087 A1* | 3/2014 | Bartling | H03K 3/3562 711/102 |
| 2014/0075232 A1* | 3/2014 | Bartling | H03K 3/3562 713/324 |
| 2016/0364298 A1* | 12/2016 | Chiou | G06F 11/1441 |

OTHER PUBLICATIONS

Khanna, Sudhanshu et al., A FRAM-Based Nonvolatile Logic MCU SoC Exhibiting 100% Digital State Retention at VDD=0V Achieving Zero Leakage with <400-ns Wakeup Time for ULP Applications, IEEE, Jan. 2014 (Year: 2014).*

Sheng, Xiao et al., SPaC: A Segment-based Parallel Compression for Backup Acceleration in Nonvolatile Processors, Tsinghua National Laboratory for Information Science, Mar. 2013 (Year: 2013).*

Onizawa et al., A Sudden Power-Outage Resilient Nonvolatile Microprocessor for Immediate System Recovery, IEEE, Aug. 2015 (Year: 2015).*

* cited by examiner

Require : $\Phi = \{\varphi_1, \varphi_2, \varphi_3, ..., \varphi_n\}$,
*$\Phi$ is a communication interface set of the $NV - \mu P$, n is the total interface numbers.*
1 : $\varphi_j \leftarrow N$ ;
2 : While power detector = 1 or ISR request = 1 do
3 : Detect $B = \bigcup_{j=1}^{n} B_j$ ;
    /* The system detects TX buffers of communication interfaces */
4 : if $B\_EF = \bigcup_{j=1}^{n} B\_EF_j = 0$ then /* All buffers are empty */
5 : Interface_CFG &= RST ;
    /* The system does not need to resume communication interfaces */
6 : end if
7 : if $B\_EF = \bigcup_{j=1}^{n} B\_EF_j \mathrel{!}= 0$ then /* Some interfaces still exist data */
    /* The system needs to resume communication interfaces */
8 : if $\varphi_j$ is UART & $B\_EF_j \mathrel{!}=0$ then
9 : UART_CFG &= ~$RST_j$ ;
10 : end if
11 : if $\varphi_j$ is I2C & $B\_EF_j \mathrel{!}=0$ then
12 : I2C_CFG &= ~$RST_j$ ;
13 : end if
14 : if $\varphi_j$ is SPI & $B\_EF_j \mathrel{!}=0$ then
15 : SPI_CFG &= ~$RST_j$ ;
16 : end if
    ... /* The other interfaces */
17 : end if
18 : end while

FIG. 4

ENERGY-EFFICIENT NONVOLATILE MICROPROCESSOR

BACKGROUND OF THE INVENTION

1. Field of the Invention

The present invention relates to the technical field of processors and, more particularly, to an energy-efficient nonvolatile microprocessor with a processing core which is provided with a memory map containing a reset entry and a system states recovery entry directed to an expected handling process. When a power source is recovered to a stable state, the processing core starts with the system states recovery entry to execute the expected handling process for overcoming different system states recovery exceptions generated by the microprocessor in different application situations. The energy-efficient nonvolatile microprocessor makes use of a system states partition (SYSPA). When the power source is unstable, the processing core only stores the programmer visible states, so as to effectively save the area of a nonvolatile flip-flop array and the energy consumption required for storage. Another energy-efficient method is provided to store the system states of peripheral modules corresponding to the bits of the store-enable register that are set to be "true" into the nonvolatile flip-flop array.

2. Description of Related Art

With development of low-power IC designs, modern living is full of a variety of novel electronic apparatuses and application scenarios, such as wearable devices, implantable devices, ambient sensors, home automation, wireless body area networks (WBANs), Internet of things (IoT), and the like. Such electronic apparatuses are equipped with difference functions and requirements based on different application scenarios. Therefore, the cost is high and it is inefficient to design application specific integrated circuits (ASICs) for a dedicated application only. With the microprocessors, it is able to satisfy the system requirements in different application scenarios by programing the embedded software in operation and changing the arrangement of modules cooperated with the microprocessors. Accordingly, the microprocessors are used as a system operating core in general.

By analyzing the application scenarios, it can be seen that the application mode is typically a periodic task. In one cycle, the actual active time is much shorter than the idle time for the system. For example, in the wireless body area network (WBAN) applications, the sample rates of the sensors used are typically in the range of several Hz to several KHz. Thus, such applications are also known as low duty-cycle applications.

In the low duty-cycle applications, a microprocessor is mostly at idle state. In general, the system uses a battery or an energy harvesting technique as a power source. Thus, it is an essential design approach for a microprocessor to increase the battery lifetime by reducing the system power consumption and maintain the system operation with limited extracted energy.

Currently, in common low-power microprocessor designs, there are many techniques capable of effectively reducing the dynamic power consumption, such as clock gating, dynamic voltage frequency scaling, and standard cell library for special designs. In general, the total power consumption for a system can be divided into dynamic power consumption and static power consumption. However, in the low duty-cycle applications, the system is mostly at idle or standby state, so that its static power consumption occupies the majority of total system energy. Accordingly, reduction on the static power consumption is more important than that on the dynamic power consumption for the system.

In the static power consumption reduction, one of the efficient and widely used approaches is to power off the system, either in external power-off or in virtual VDD off by a power gating technique, which can effectively reduce the power consumption to achieve the purpose of reducing the static power consumption. However, the power-off behavior may cause a loss of data stored in the internal flip-flops and SRAMs and further a loss of system states. Accordingly, when the microprocessor has to be recovered from the power-off mode to an active state, it is necessary to execute a rebooting process. Based on the complexity of the microprocessor system, the booting process takes the time in a range from hundreds of microseconds to a few seconds. The energy and operating time consumed by the system during the booting process leads to a huge amount of overheads.

Recently, a novel nonvolatile microprocessor is proposed, with which an emerging nonvolatile memory or nonvolatile flip-flop is embedded in the system, so as to rapidly store the system states in the merging nonvolatile memory just before power-off. Next, the system enters in the power-off mode to save the static power consumption. Since the nonvolatile memory can keep the internal data after power-off, the system can quickly read data from the nonvolatile memory and restore its active states as needs, such that the overhead required for the booting process is eliminated. Hence, the problems of static power consumption and booting overhead are overcome.

From the above description, it is known that the nonvolatile microprocessors have three new characteristics in normally-off computing: (1) zero standby power; (2) instant on-off feature; and (3) resilient to power failure.

Current implementation of nonvolatile processors is divided into main memory level implementation, flip-flop/register level implementation, and combination thereof.

The main memory level implementation is provided to arrange the nonvolatile memory in a level as same as the main memory level. The nonvolatile memory has the features of random access, high access speed, and nonvolatile data storage. Therefore, in M. Zwerg, A. Baumann, R. Kuhn, M. Arnold, R. Nerlich, M. Herzog, R. Ledwa, et al. "An 82 uA/MHz Microcontroller with Embedded FeRAM for Energy-Harvesting Applications" issued in Proc. IEEE International Solid-State Circuits Conference Digest of Technical Papers (ISSCC), pp. 334-36, 2011, a ferroelectric random access memory (FeRAM) is used as a data memory and program memory in the system. Thus, when a processing unit of the microprocessor performs store and restore operations, it has to use a bus for access to a nonvolatile memory, and the data access to the nonvolatile memory requires more time and energy to complete the store and restore operations.

The flip-flop/register level implementation is divided into a fully replacement method and a parallel compare and compress Codec (PACC) method.

The fully replacement method is provided to fully store the system states at flip-flop/register level. In W. Yu, S. Rajwade, S.-E. Wang, B. Lian, G-E. Suh, and E. Kan "A non-volatile microcontroller with integrated floating-gate transistors" issued in Proc. International Conference on Dependable Systems and Networks Workshops (DSN-W), pp. 75-80, 2011, an Xilinx PicoBlaze-based configuration is used to implement a nonvolatile microprocessor, which replaces all memory cells in the based configuration with 989 floating-gate nonvolatile flip-flops. The memory cells include general purpose registers (GPRs), a scratch pad, a system stack, a conditional register (Cond), an instruction register (Inst. reg), and a program counter (PC). The floating-gate nonvolatile flip-flops need a higher driving voltage (6V), and thus a power monitor, a nonvolatile (NV) controller, and charge pumps are added.

However, the nonvolatile flip-flops occupy a huge area, so that the fully replace method has a vast area overhead. In Y. Wang, Y. Liu, Y. Liu, D. Zhang, S. Li, B. Sai, M.-F. Chiang, and H. Yang "A Compression-based Area-efficient Recovery Architecture for Nonvolatile Processors" issued in Proc. Design, Automation Test in Europe Conference Exhibition (DATE), pp. 1519-1524, 2012, it is observed that the system states inside the system remain the same as the original reset states over an 80% probability when the system is running Hence, after the system states and a preliminary state table are performed with an XOR operation, a large amount of continuous 0s or 1s are obtained due to the same states. In this case, the compare and compress Codec (PACC) method can take a data compression through a run length coding algorithm and implement parallel running length coding (PRLC) Codec with a parallel process, thereby reducing the number of required nonvolatile flip-flops for area reduction consideration.

In implementing a nonvolatile logic array (NVL array) by combining the main memory level and flip-flop/register level implementations, it uses many small memory arrays to store the system states, which can increase the data transmission bandwidth in store and restore operations. In S. C. Bartling, S. Khanna, M. P. Clinton, S. R. Summerfelt, J. A. Rodriguez, and H. P. McAdams "An 8 MHz 75 uA/MHz Zero-leakage Non-volatile Logic-based Cortex-M0 MCU SoC Exhibiting 100% Digital State Retention at VDD=0V with <400 ns Wakeup and Sleep Transitions" issued in Proc. International Solid-State Circuits Conference Digest of Technical Papers (ISSCC), pp. 432-433, 2013, it implements the nonvolatile microprocessor based on the Cortex-M0 instruction set and adds ten FeRAM-based nonvolatile logic (FeRAM NVL) arrays each having 8×32-bit memory size. The ten FeRAM NVL arrays are in charge of state storage or backup of 2537 flip-flops (FFs). The functions of self-test (BIST) and error correcting code (ECC) are built in the FeRAM NVL arrays to increase the system testability and reliability.

In the nonvolatile microprocessors as cited above, only their hardware designs are considered for most situations, which are focused on replacing conventional volatile devices with nonvolatile devices. For the operation of a nonvolatile microprocessor after the system is restored, the prior art directly restarts from the time point of storing the system states. However, in the real applications, the microprocessor is not a stand-alone unit and often cooperates with a number of peripheral modules such as a tri-axial accelerator, a temperature sensor, and the like through the communication interfaces including UART, SPI, and I2C.

In some system applications, the microprocessor is responsible of time-related works in the real world such as a light control of street lights or billboards. It can be seen that the system states are equivalent to be suspended at the time point of storing them in the nonvolatile storage.

Accordingly, after a period of time, the system takes the states recovery action. The nonvolatile processor itself recognizes the time as the time point of storing the system states, which may encounter a problem that the communication interfaces between the nonvolatile microprocessor and its cooperated modules are not in synchronization or, in the actual time related applications, a time difference exists between the time recognized by the nonvolatile microprocessor and the actual time. Such problems result in an abnormal operation after the system states are restored, which is known as system state recovery exceptions, which may cause the system to be operated abnormally.

In the prior papers, the nonvolatile microprocessors are all implemented to restart directly from the location where the system states are stored. Such implementations cannot make sure the program entry point after the system restore, and thus the programmer is unable to insert a fragment of handling process after the system states are recovered.

FIG. 1 is a schematic diagram illustrating an operation of state recovery of a typical nonvolatile microprocessor. Label (1) indicates that the system runs at an address of 0xA200 before power off, and in this case the system stores the system states first and then powers off. Label (2) indicates that the power source is recovered, and the system restores the stored system states. Label (3) indicates that the system restarts from the address executed before power off, i.e., executing the address immediately following 0xA200. The system may encounter an unexpected power interruption at any time point, and thus its execution point is not fixed before the power is suddenly shunted down, so that the program entry point is not known after the system is restored. Therefore, after the system states are recovered, the programmer is unable to insert a handling process. In addition, the nonvolatile processor itself recognizes the time as the time point of storing the system states, which may encounter a problem that the communication interfaces between the nonvolatile microprocessor and its cooperated modules are not in synchronization, or a time difference exists between the time recognized by the nonvolatile microprocessor and the actual time. Accordingly, when Label (4) is executed, the system will produce an unexpected exception, which causes the system operation to encounter failure, instability or even crash.

Therefore, it is desirable to provide an improved nonvolatile microprocessor to mitigate and/or obviate the aforementioned problems.

SUMMARY OF THE INVENTION

The object of the present invention is to provide an energy-efficient nonvolatile microprocessor, with which a programmable restore entry decision (PREDEC) is used to place an expected handling process at a fixed address for overcoming the problem that the communication interfaces between the typical nonvolatile microprocessor and its cooperated modules are not in synchronization or a time difference exists between the time recognized by the nonvolatile microprocessor and the actual time. In addition, the energy-efficient nonvolatile microprocessor adapts a system states partition (SYSPA) method, such that, when the power source is unstable, a processing core only stores programmer visible states, and thus the area of a nonvolatile flip-flop array and the energy consumption required for storing are greatly reduced. In addition, the energy-efficient nonvolatile microprocessor adapts a selective store for eliminating redundant store (SESERS) mechanism, such that, when the power source is unstable, the processing core only stores the system states of peripheral modules corresponding to the bits of a store-enable register that are set to be "true" into the nonvolatile flip-flop array. Therefore, the area of a nonvolatile flip-flop array and the energy consumption required for storing are further reduced.

According to a feature of the present invention, there is provided an energy-efficient nonvolatile microprocessor, which includes: a processing core having a plurality of system states divided into programmer visible states and programmer invisible states; a nonvolatile flip-flop array for storing data, wherein the stored data is maintained after a power source is off; and a set of nonvolatile interconnections connected between the processing core and the nonvolatile flip-flop array, wherein the processing core only stores the programmer visible states into the nonvolatile flip-flop array through the nonvolatile interconnections when the power source is unstable.

According to another feature of the present invention, there is provided an energy-efficient nonvolatile microprocessor having a processing core provided with a memory map including a reset entry and a system states recovery entry directed to an expected handling process, wherein, when a power source is recovered to a stable state, the processing core determines whether data of nonvolatile registers of communication interfaces is not transmitted before the power source is off, and starts with the system states recovery entry to execute the expected handling process, thereby overcoming different system states recovery exceptions generated by the microprocessor in different applications.

Other objects, advantages, and novel features of the invention will become more apparent from the following detailed description when taken in conjunction with the accompanying drawings.

BRIEF DESCRIPTION OF THE DRAWINGS

FIG. 4 is a schematic graph illustrating a pseudo code of a programmable restore entry decision (PREDEC) according to the invention;

DETAILED DESCRIPTION OF THE PREFERRED EMBODIMENT

Figure 1:
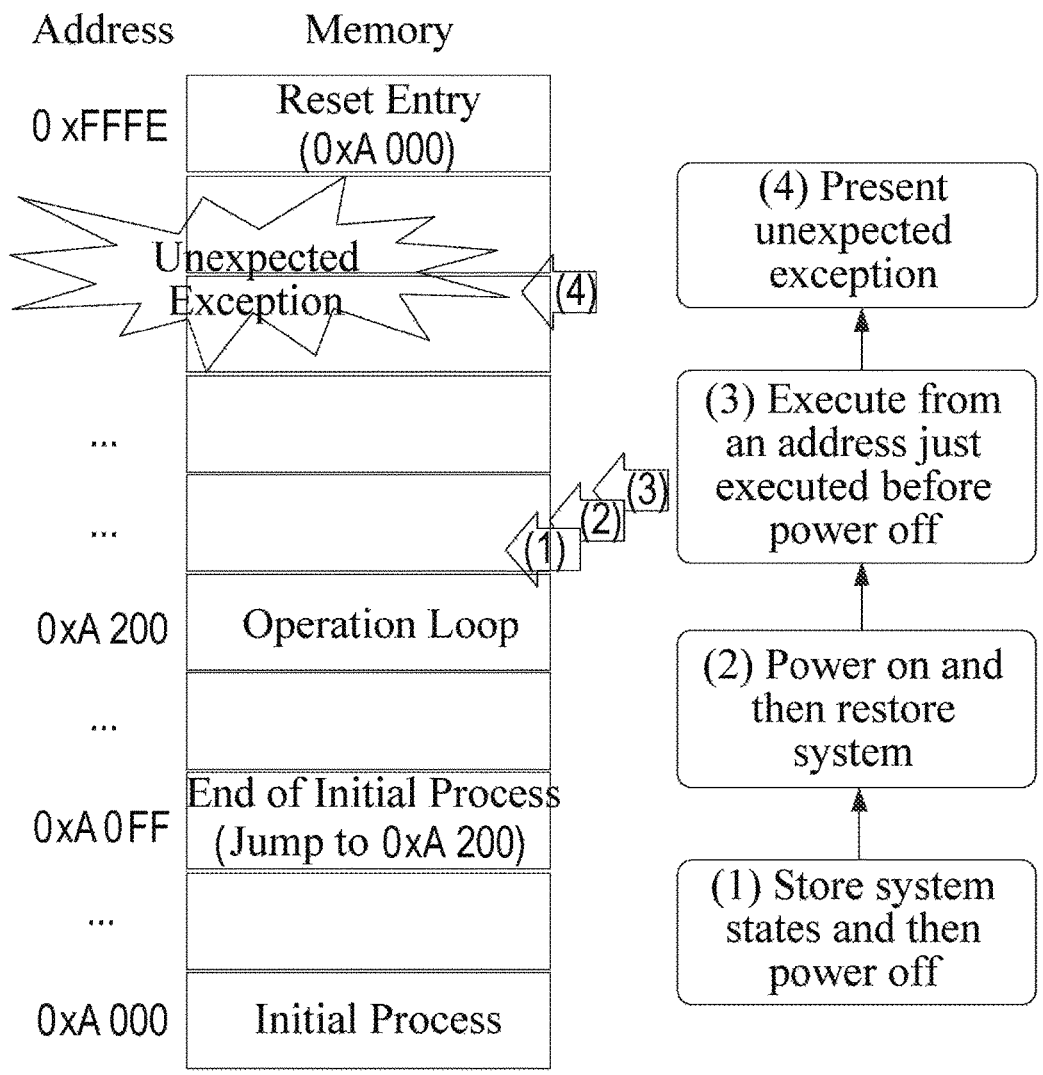
FIG. 1 is a schematic view illustrating a conventional restore operation for a typical nonvolatile microprocessor.
Figure 2:
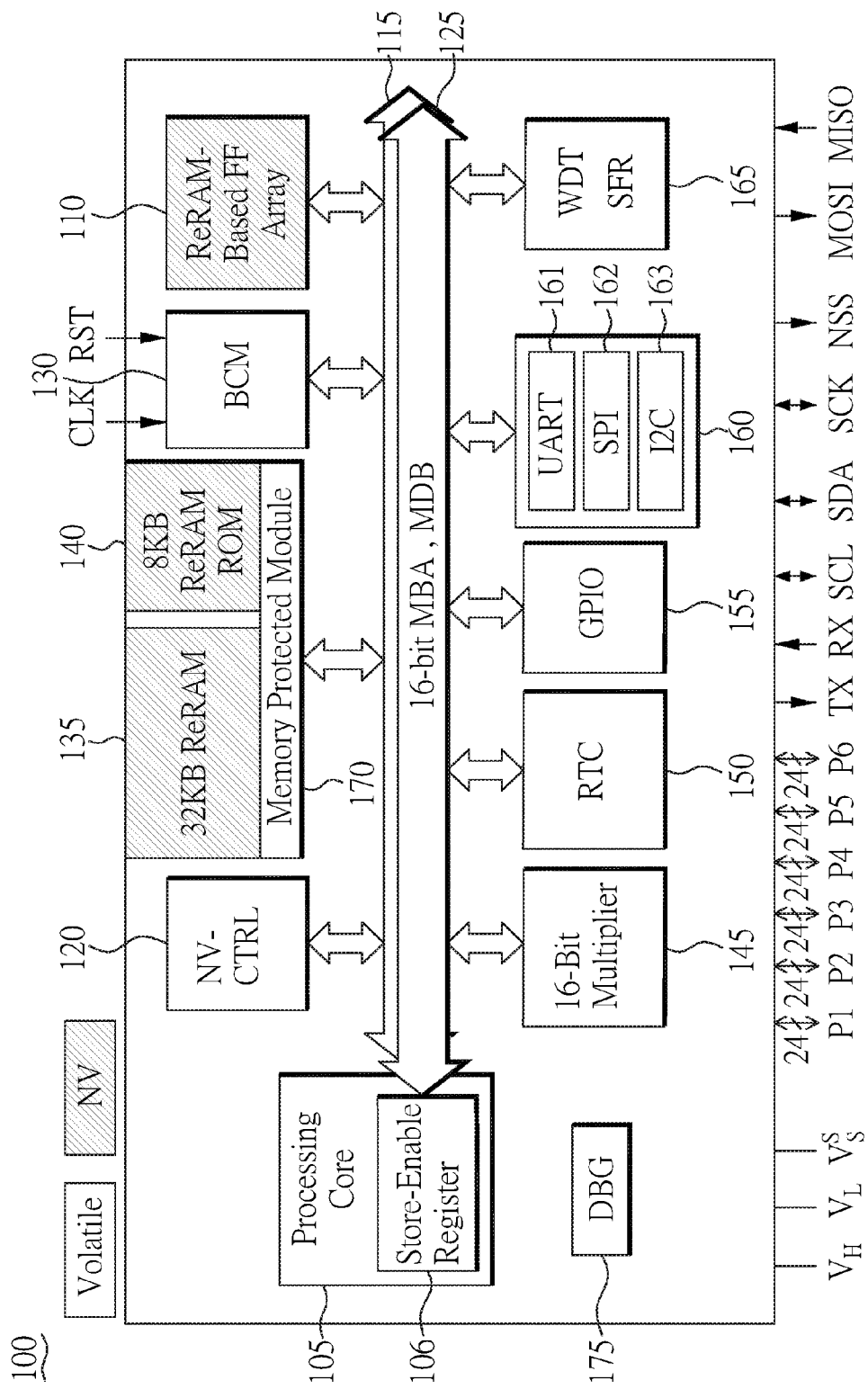
FIG. 2 is a block diagram illustrating a system of an energy-efficient nonvolatile microprocessor according to the invention.

FIG. 2 is a block diagram illustrating a system of an energy-efficient nonvolatile microprocessor 100 according to the invention. The microprocessor 100 includes a processing core 105, a nonvolatile flip-flop array 110, a set of nonvolatile interconnections 115, a nonvolatile operation controller (NV-CTRL) 120, a communication bus 125, a basic clock module (BCM) 130, a resistive random-access memory (ReRAM) 135, a resistive random-access memory read-only memory (ReRAM ROM) 140, a 16-bit multiplier 145, a real-time counter (RTC) 150, a general purpose input/output (GPIO) 155, a serial port 160, a watchdog timer and special function register (WDT SFR) 165, a memory protected module 170, and a debug port 175.

The serial port 160 includes several communication interfaces which are a universal asynchronous receiver transmitter (UART) 161, a serial peripheral interface (SPI) 162, and an inter-integrated circuit (I2C) 163.

Figure 3:
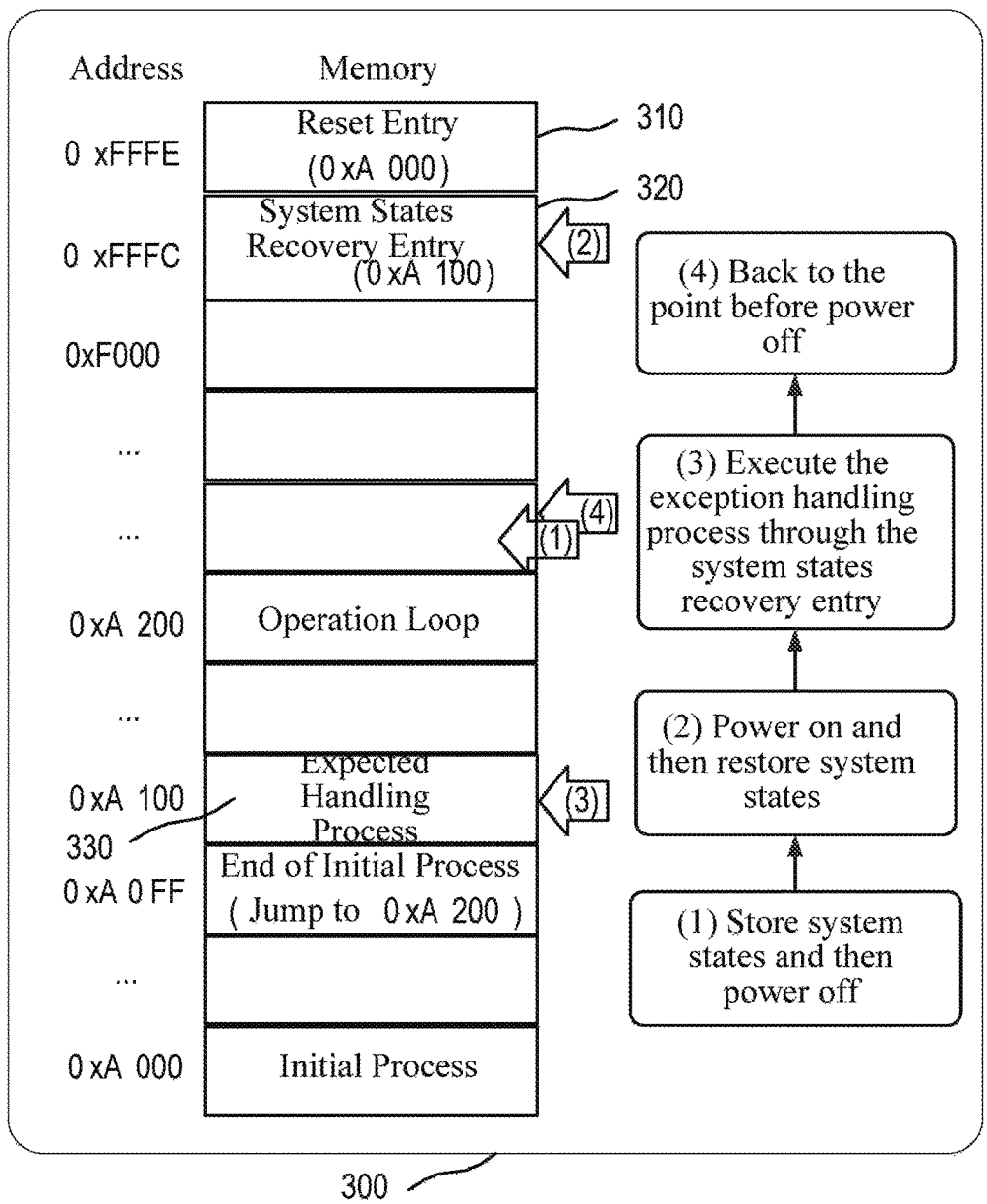
FIG. 3 is a schematic view illustrating a memory map of a processing core for an execution process according to the invention.

To overcome the problem of system restore failure caused by directly restarting from the interrupted time point that is stored in memory before power-off in the prior art, the invention provides a programmable restore entry decision (PREDEC). FIG. 3 is a schematic view illustrating a memory map of the processing core for an execution process according to the invention. The memory map of the processing core 105 includes a reset entry 310 and a system states recovery entry 320. The system states recovery entry 320 is directed to an expected handling process 330.

A booting process is slightly different in microprocessor systems due to their cores, configurations, and applications. However, in general, the booting process sequentially completes the following tasks: (A) identifying and initializing system peripherals; (B) setting up system stacks; (C) initializing system-wide variables in memory; (D) performing diagnostics and integrity check-up; and (E) loading an operating system or other type program.

The booting process is implemented in a microprocessor by recording the software capable of completing the cited tasks into an accessible nonvolatile memory by the core. When the microprocessor system is reset, the execution process of the core is directed to an address with the booting process. This is referred to as reset address identifications that currently have two popular ways, one being jump table and the other being auto-vector. In this embodiment, a reset address identification used in the processing core 105 is the auto-vector. As shown in FIG. 3, after a normal reset, a program counter (PC) of the processing core 105 is directed to an address of 0xFFFE for execution, and then the program counter (PC) is directed to an address of 0xA00 to execute an initialization-related operation. After the initialization, the PC is directed to an address of 0xA200 to execute a corresponding application program.

In the proposed PREDEC, the expected handling process 330 can be disposed at a fixed address. In this embodiment, the expected handling process 330 is disposed after the initialization and before the general application program, i.e., the address of 0xA100 in FIG. 3. In other embodiments, the expected handling process 330 can be disposed at 0xA102. In addition, memory addresses for all execution processes of FIG. 3 can be decided by programmers.

While the processing core 105 executes the corresponding application program, a power abnormality is encountered or a power-efficient mode is requested, as shown in label (1) of FIG. 3. In this case, the processing core 105 stores corresponding system states, such as programmer visible states, to the nonvolatile flip-flop array 110.

As shown in label (2) of FIG. 3, due to the abnormal system power-on, when the power source is recovered to a stable state, the processing core 105 starts from the system states recovery entry 320 for execution. A nonvolatile flag in the processing core 105 can be set to determine whether the processing core 105 is normally powered on. As shown in label (3) of FIG. 3, the processing core 105 executes the expected handling process 330 through the system states recovery entry 320 so as to overcome the different system states recovery exceptions generated by the microprocessor in different application situations.

FIG. 4 is a schematic graph illustrating a pseudo code of the programmable restore entry decision (PREDEC) 300 according to the invention. As shown in FIG. 4, the processing core 105 executes the expected handling process 330 to overcome the different system states recovery exceptions generated by the microprocessor in different application situations. Next, as shown in label (4) of FIG. 3, after the processing core 105 executes the expected handling process, the operation interrupted by the power-off can be continued. Namely, the system executes the expected handling process 330 to exclude the possible exceptions before the system recovery entry is entered, and the operation is resumed. This can increase the system robustness.

Figure 5:
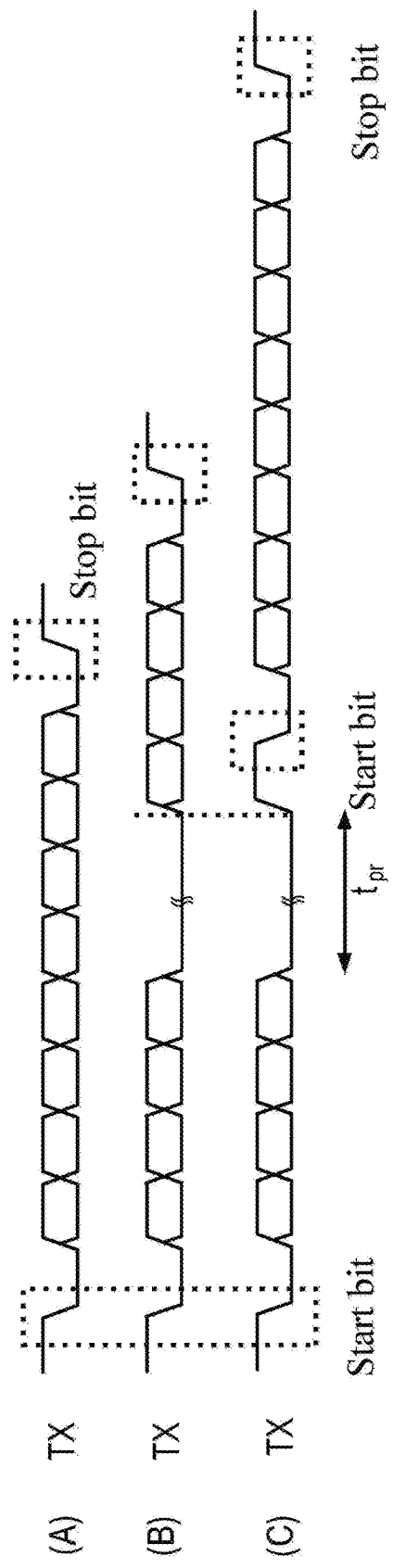
FIG. 5 is a schematic graph illustrating an exemplary UART interface of the invention compared with the prior art, where (A) indicates a schematic diagram of a UART transmission protocol, (B) indicates a schematic diagram of a conventional restore operation, and (C) indicates a schematic diagram of a recovery operation according to the invention.

FIG. 5 is a schematic graph illustrates an exemplary UART interface of the invention compared with the prior art. Portion (A) of FIG. 5 is a schematic diagram of a UART transmission protocol, in which a frame includes one start bit, eight data bits, and one stop bit. Portion (B) of FIG. 5 is a schematic diagram of using a conventional restore method from the original store entry. The conventional nonvolatile microprocessor stores the system states in the nonvolatile memory when the system suffers power loss during data transmission by the UART, and then the transmitter and receiver stop communication with each other. As the power restores, the microprocessor performs a system restore operation and directly continues the procedure after the power restores. However, because the nonvolatile microprocessor system is disconnected with the external transmission interface before the power-off, the way of directly continuing the procedure causes the nonvolatile microprocessor to drive the UART interface to send out the data that is not completely transmitted yet before the power-off. The data may be mistakenly treated as a new one for the receiver, which happens because the UART transmission frame is broken down when power is off. Accordingly, a frame error is encountered because an unidentified communication between the microprocessor and the UART communication interface occurs.

Portion (C) of FIG. 5 is a schematic diagram illustrating a recovery operation according to the invention. As soon as the power restores, the programmable restore entry decision 300 is executed to check through a program whether a UART transmission is interrupted. If yes, the interrupted transmission is restarted to transmit the complete frame again. Thus, the transmission error caused by the power off is corrected.

With reference to FIG. 2 again, the nonvolatile flip-flop array 110 stores data, and the stored data is maintained after a power source is off. The array 110 is a resistive nonvolatile flip-flop array (ReFF array). The nonvolatile interconnections 115 are connected between the processing core and the nonvolatile flip-flop array. Based on the actual requirement, the programmer can select one of the nonvolatile interconnections as a bridge for connection between the processing core and one nonvolatile flip-flop of the array 110. In other embodiments, the array 110 can be a nonvolatile flip-flop array consisting of other nonvolatile components.

The nonvolatile operation controller 120 controls writing and reading of the nonvolatile flip-flop array 110, the ReRAN/I 135, and the ReRAM ROM 140.

The basic clock module 130, the ReRAN/I 135, the ReRAN/I ROM 140, the 16-bit multiplier 145, the RTC 150, the GPIO 155, the serial port 160, and the WDT SFR 165 are connected to the communication bus 125. The processing core 105 can access the cited devices or modules connected to the communication bus 125 through memory mapping. The operations of the devices connected to the communication bus 125 are known by those skilled in the prior art according to the disclosure of the invention, and thus a detailed description therefor is deemed unnecessary.

In the energy-efficient nonvolatile microprocessor 110 as shown in FIG. 2, the array 110, the ReRAM 135, and the ReRAM ROM 140 belong to a nonvolatile device. In this embodiment, the processing core 105 is an aMSP430-compatible processing core and has a plurality of system states divided into programmer visible states and programmer invisible states.

As shown in FIG. 3, the invention uses the programmable fixed system states recovery entry to direct the microprocessor into a known program for the normal operation. Accordingly, the system states that have to be kept are those that can be changed by instruction operations, and the system states that cannot be changed by instruction operations are not required to be kept. Hence, a system states partition (SYSPA) is provided in the invention to classify the system states into programmer visible states and programmer invisible states.

The programmer visible states indicate some of the system states that are directly accessed by an instruction set of the processing core 105, which include allocated arrays, peripheral registers configurations, register files, logged data, and system stacks. The programmer invisible states indicate the other system states that are unchangeable by the instruction set, which includes states machines, buffers, and synchronizers.

When the power source is unstable, the processing core 105 only stores the programmer visible states into the nonvolatile flip-flop array 110 through the nonvolatile interconnections 115. When the power source is recovered to a stable state, the processing core 105 restores its programmer visible states that are stored in the nonvolatile flip-flop array 110.

Figure 6:
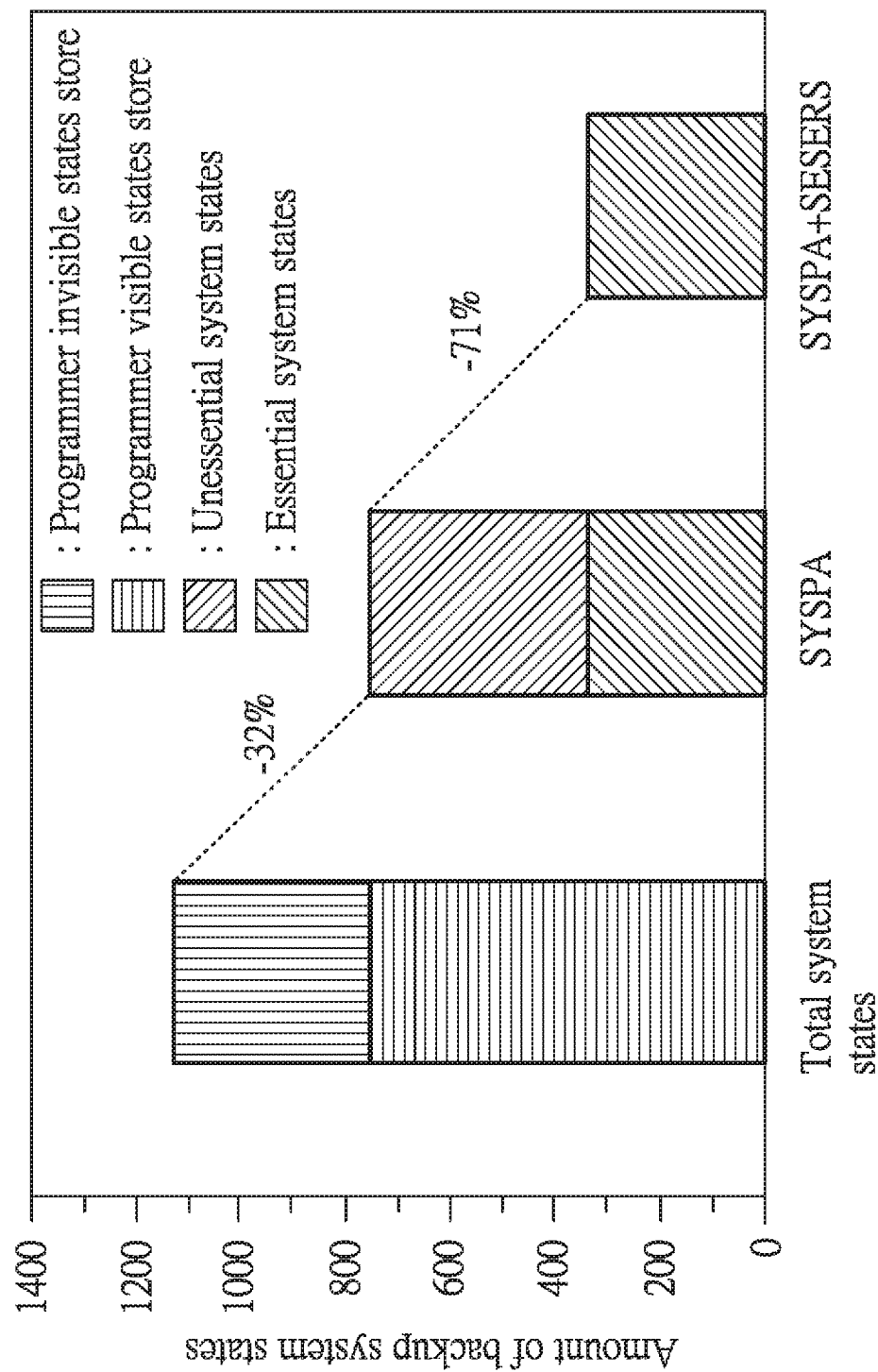
FIG. 6 is a schematic graph illustrating a system states partition (SYSPA) and a selective store for eliminating redundant store (SESERS) mechanism according to the invention.

By taking a compatible MSP430 microprocessor as a standard, the standard compatible MSP430 microprocessor has 1120 system states in total, which are divided into 761 programmer visible states and 359 programmer invisible states. In this case, only the programmer visible states are required to be stored into the nonvolatile storage such as the nonvolatile flip-flop (NV-FF) array 110. With the proposed SYSPA, the number of nonvolatile flip-flops required by the system can be reduced by 32%, as shown in FIG. 6. Thus, the area overhead required for implementing the nonvolatile microprocessor and the energy consumption in storing are reduced.

In addition to the processor core, the current microprocessor system generally includes plural peripheral modules. For example, the energy-efficient nonvolatile microprocessor 100 of the invention also includes peripherals such as a 16-bit multiplier 145, a real-time counter (RTC) 150, a general purpose input/output (GPIO) 155, a serial port 160, a watchdog timer and special function register (WDT SFR) 165, and a memory protected module 170.

For a microprocessor application, the microprocessor usually does not use all peripheral modules. For those unused modules, their states are not changed when program is running, and thus are kept at default states. In this case, the operation of the nonvolatile microprocessor system is not influenced in case that those unchanged system states are not stored, which is called as a redundancy store operation.

To avoid the redundancy store operation, a selective store for eliminating redundant store (SESERS) is provided in the invention. In the SESERS mechanism, the processing core 105 further includes a store-enable register 106, each bit of which maps to the enable state of each peripheral module. The store-enable register 106 can provide related information for the nonvolatile microprocessor 100. The related information can be the used peripheral modules in currently running programs, for example. According to the related information provided by the store-enable register 106, it is clearly known whether the peripheral modules are used in the application.

For the microprocessor 100 of the invention, the store-enable register 106 has bit 0 corresponding to the 16-bit multiplier 145, bit 1 corresponding to the real-time counter 150, bit 2 corresponding to the GPIO 155, bit 3 corresponding to the UART 161, bit 4 corresponding to the SPI 162, bit 5 corresponding to the I2C 163, bit 6 corresponding to the WDT SFR) 165, and the like.

Namely, when the store-enable register 106 is "1" (i.e., "true") at bit 0, it indicates that the 16-bit multiplier 145 is used. When the power source is unstable, the processing core 105 only stores the system states of the peripheral modules corresponding to the bits of the store-enable register that are set to be "true" into the nonvolatile flip-flop array 110. By checking the status of the peripheral modules, it is found that the bits of the store-enable register corresponding to five peripheral modules are off or not "true", and thus the number of system states required to be stored is reduced by 71%, as shown in FIG. 6.

With the store-enable register 106, the programmer can use memory mapping and simple instruction operations to change data of the store-enable register 106 and control store-enable signals of the peripheral modules of the microprocessor 100. The data of the store-enable register is detected to decrease the amount of redundancy store operations.

FIG. 6 is a schematic graph illustrating the system states partition (SYSPA) and the selective store for eliminating redundant store (SESERS) mechanism according to the invention. As shown in FIG. 6, for the original 1120-bit system states of the compatible MSP430 microprocessor, the 1120-bit system states are divided into 761-bit programmer visible states and 359-bit programmer invisible states based on the inventive SYSPA. The inventive SYSPA only needs to store the 761-bit programmer visible states in the array 110, so that the microprocessor can reduce the number of the nonvolatile flip-flops by 32%. When using the inventive SESERS mechanism, it can set the bits of the store-enable register 106 corresponding to the disabled modules, such as the 16-bit multiplier 145, GPIO 155, RTC 150, UART 161, and SPI 162, to "0" (i.e., "false"), such that, as shown in FIG. 6, the number of used nonvolatile flip-flops is reduced by 71%.

On the other hand, the conventional fully replacement method needs to store the complete system states in the ReFF array, so that it needs a 1120-bit nonvolatile storage for the ReFF array, i.e., the array has 1120 resistive flip-flops (ReFFs).

The conventional PACC method compresses the complete system states through a Codec and stores the compressed code in the ReFF array. In this case, the 1120-bit system states are compressed to be 399-bit, so that only a 399-bit nonvolatile storage is required for maintaining the code.

The conventional NVL array method stores all the system states in nine 8*16-bit ReRAM NVL arrays.

As cited, the invention implements the nonvolatile microprocessor by classifying the system states and only storing the programmer visible states in the ReFF array, and in this case only a 761-bit nonvolatile storage is needed.

Figure 7:
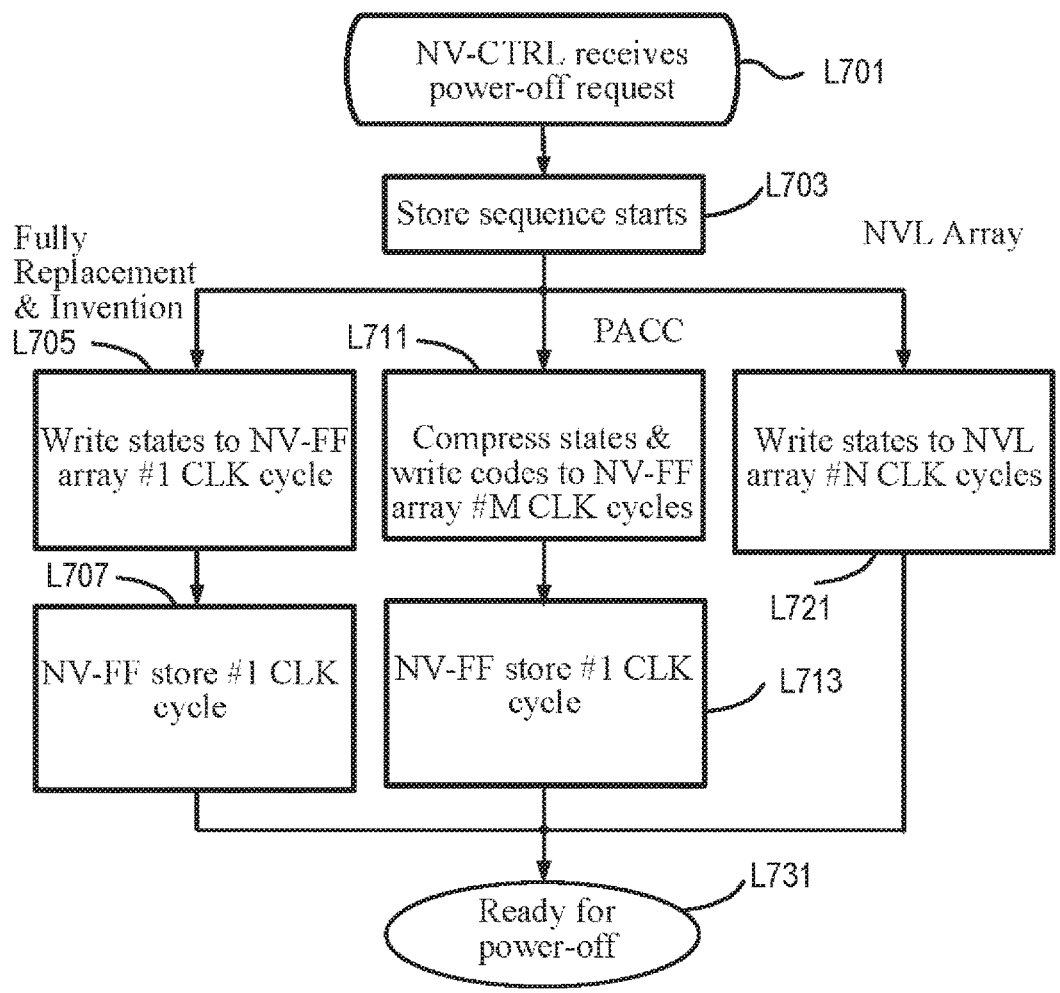
FIG. 7 is a flowchart illustrating a system store operation of the invention compared with the prior art.

FIG. 7 is a flowchart illustrating a system store operation of the invention compared with the prior art. In FIG. 7, it shows a system store operation of the invention compared with the conventional fully replacement, PACC, and NVL array. This starts with a power-off request received by the nonvolatile controller (label L701) and ends when the system completes the store operation and pulls a signal of ready for power-off (label L731). For the store operation flow, the fully replacement and the invention are the same. Namely, when the power-off request is received (label L701), the controller activates the store sequence in label L703 to write the system states to the nonvolatile flip-flops (NVFFs) of the ReFF array through the nonvolatile interconnections (label L705). Subsequently, in label L707, the NVFF store is operated to write circuit store values or data of the NVFFs to nonvolatile devices to thus complete the store sequence and pull the signal of ready for power-off (label L731). For the PACC method, it has to spend approximately M clock cycles (in this embodiment, about 300 clock cycles) to compress data of the system states (label L711) after the store sequence is activated (label L703). Apart of compressed code is continuously written to the ReFF array during the compression. When the compression of the system states and its compressed code write are completely done, the PACC method begins the store operation to the NVFFs (label L713) so as to sequentially complete the store sequence of the system. When the resistive NVL array method activates the store sequence, eight clock cycles are used to write the system states (label L721) since the resistive NVL array contains eight word lines each having a 16-bit storage. As such, the system store process ends without additional device store operation, where the resistive NVL array itself is a nonvolatile storage space.

Figure 8:
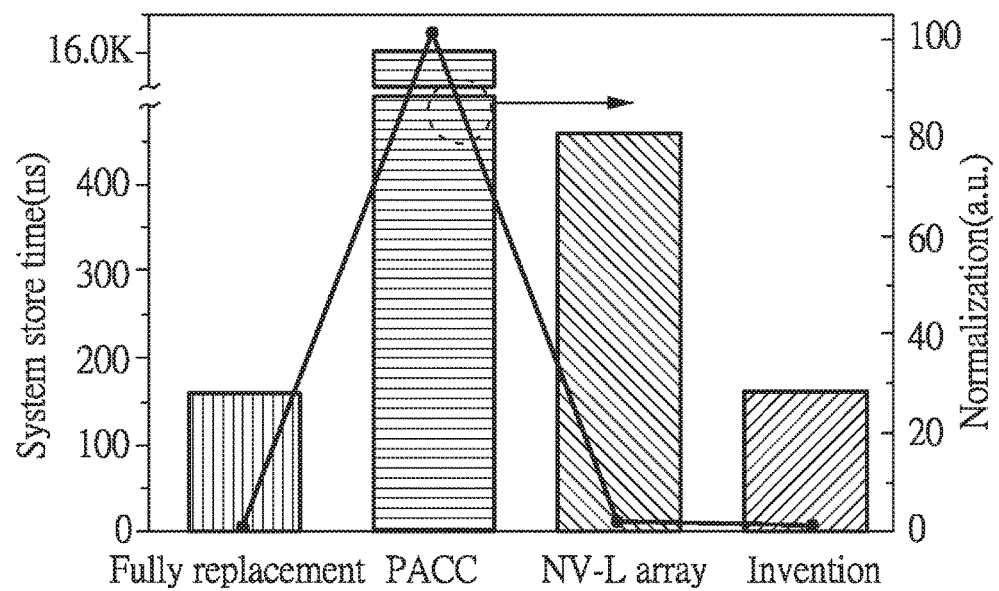
FIG. 8 is a schematic graph illustrating a simulation of system store time of the invention compared with the prior art.

FIG. 8 is a schematic graph illustrating a simulation of system store time of the invention compared with the prior art. The simulation of system store time performs a co-simulation through Synopsys VCS and Nanosim simulators. The simulation models of digital function blocks use post-synthesis netlists obtained from cell based design flow, while those of NV function blocks are SPICE netlists generated by post-layout and RC extraction through full custom design flow. The invention, conventional fully replacement, PACC, and NVL array are all implement on the compatible MSP430 test bench embedded with a ReRAM device. The compatible MSP430 test bench is operated at 20 MHz to compare and analyze the time and energy consumption based on same nonvolatile memory device and microprocessor architecture.

From the comparison of system store time shown in FIG. 8, it is known that the invention is as fast as the fully replacement due to their similar flows. The NVL array in the store time is longer because the parallel degree is lower than the invention and the fully replacement since its implementation is carried out by combining the main memory level implementation with the flip-flop/register level implementation. For the PACC, the compression process usually consumes an excessive number of clock cycles.

Figure 9:
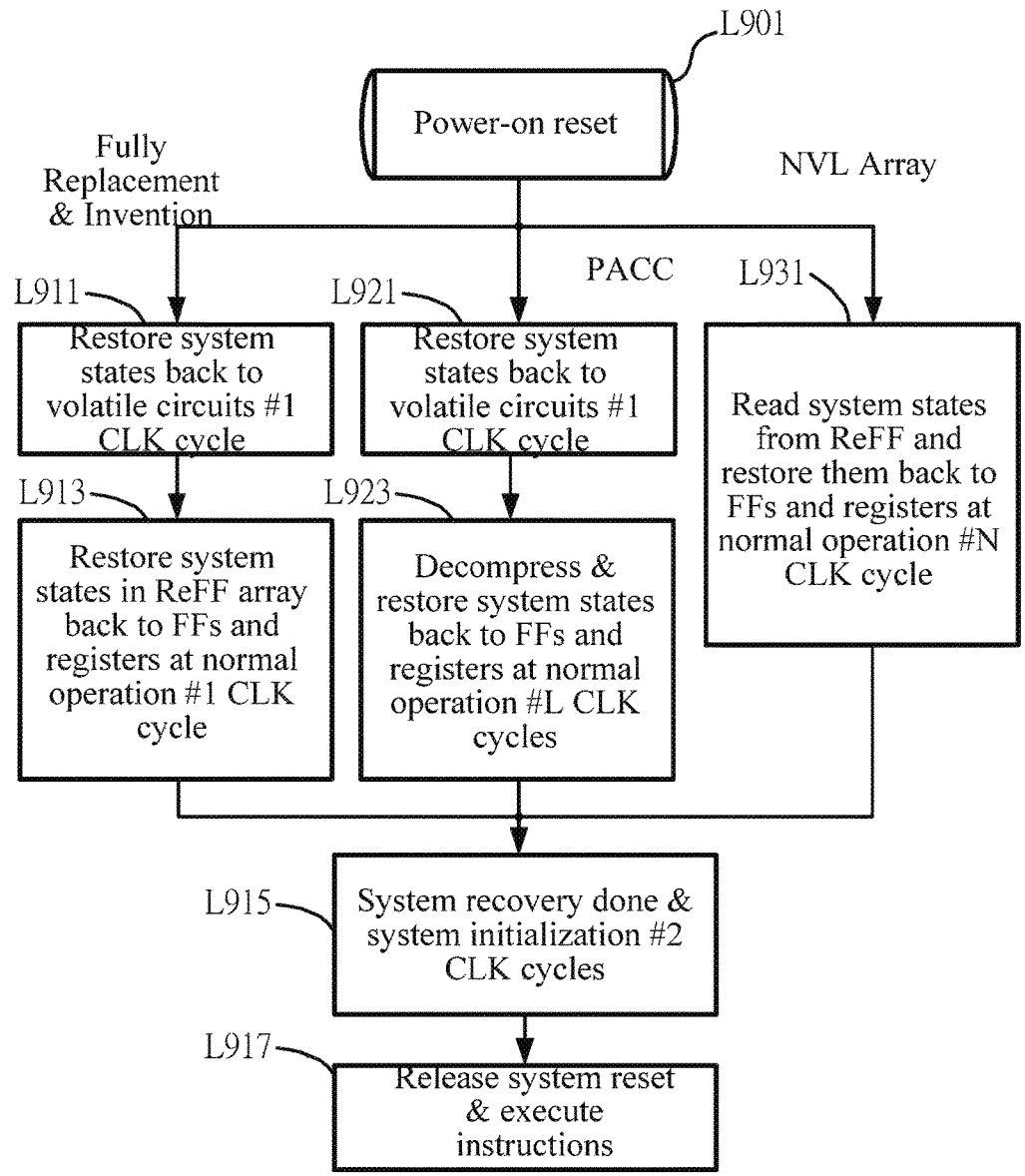
FIG. 9 is a flowchart illustrating a system restore operation of the invention compared with the prior art.

FIG. 9 is a flowchart illustrating a system recovery operation of the invention compared with the prior arts. In the system recovery operation, it starts with a power-on reset (POR) pulled up by the system (label L901), until the program starts execution. For the recovery operation flow, the invention and the fully replacement method are the same. Namely, when the power source is on for reset, the system states are restored from the NV devices of the nonvolatile flip-flops to volatile circuits (label L911). Next, the system states in the ReFF array are restored to active flip-flops and registers in the system at a normal operation (label L913). Finally, the recovery operation is completed and an initialization is performed (label L915), so that the system can release internal reset signals to start the program operation (label L917) following the previous operation before the power-off.

If using the PACC method, it needs to restore the system states from the NV devices of the nonvolatile flip-flops to the volatile circuits (label L921) as well. Next, the system needs to spend L clock cycles (in this embodiment, about 80 clock cycles) for decompressing data and restores the system states to the active flip-flops and registers in the system at a normal operation (label L915). When the decompression and recovery actions are completed, the initialization is performed to start the program operation following the previous operation before the power-off (labels L915, L917).

If the nonvolatile microprocessor exploits the NVL array as the implemented method, it consumes N clock cycles (in this embodiment, about eight clock cycles) after the power-on reset to read the system states from the NVL arrays and restore them to the active flip-flops and registers in the system at a normal operation (label L931). Next, the initialization is performed to start the program operation (labels L915, L917).

In this embodiment, the NVFF array is used to avoid the yield issue of the NV device. However, in other embodiments or for mass production, the NVFFs can be directly replaced with volatile flip-flops for the programmer visible states of the microprocessor because the yield of the volatile flip-flops is stable. Accordingly, labels L705, L913 can be omitted.

Figure 10:
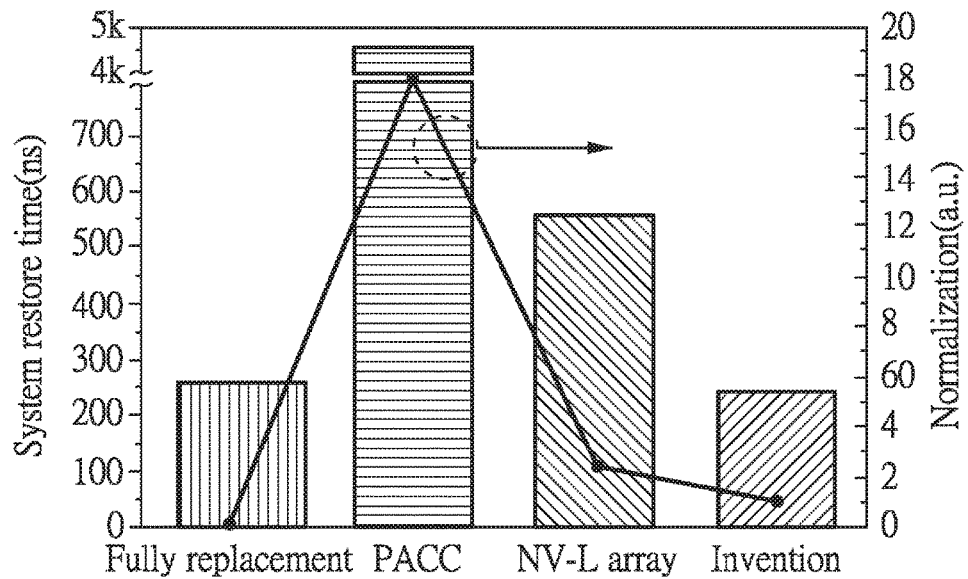
FIG. 10 is a schematic graph illustrating a simulation of the system restore time of the invention compared with the prior art.

FIG. 10 is a schematic graph illustrating a simulation of system restore time of the invention compared with the prior art. The invention and the fully replacement method have the same restore time due to the same flow. The NVL array method spends longer restore time because of the level. Although the decompression is faster than the compression, the system restore time of the PACC method spends over ten times than the other methods, as shown in FIG. 10.

Figure 11:
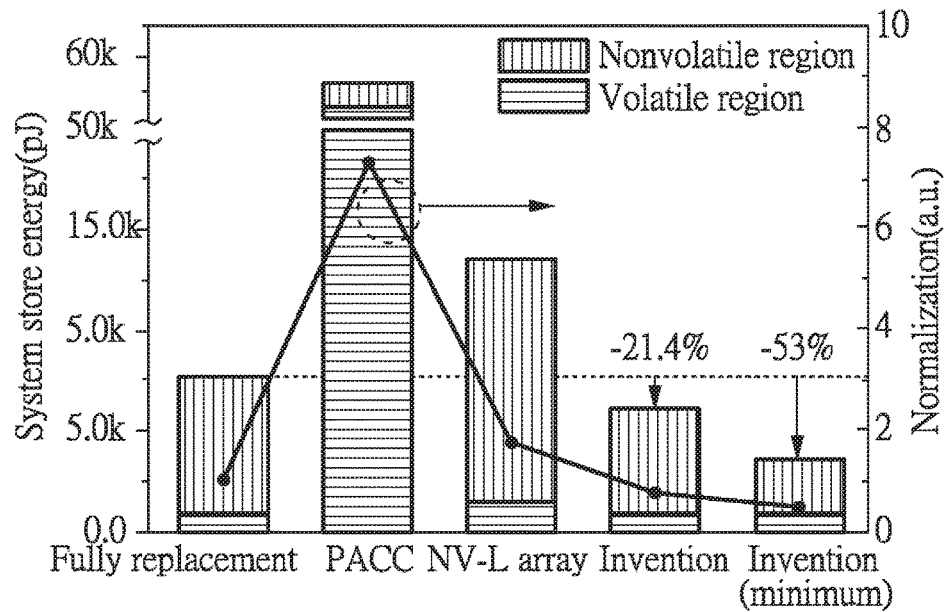
FIG. 11 is a schematic graph illustrating a simulation of the system store energy consumption of the invention compared with the prior art.
Figure 12:
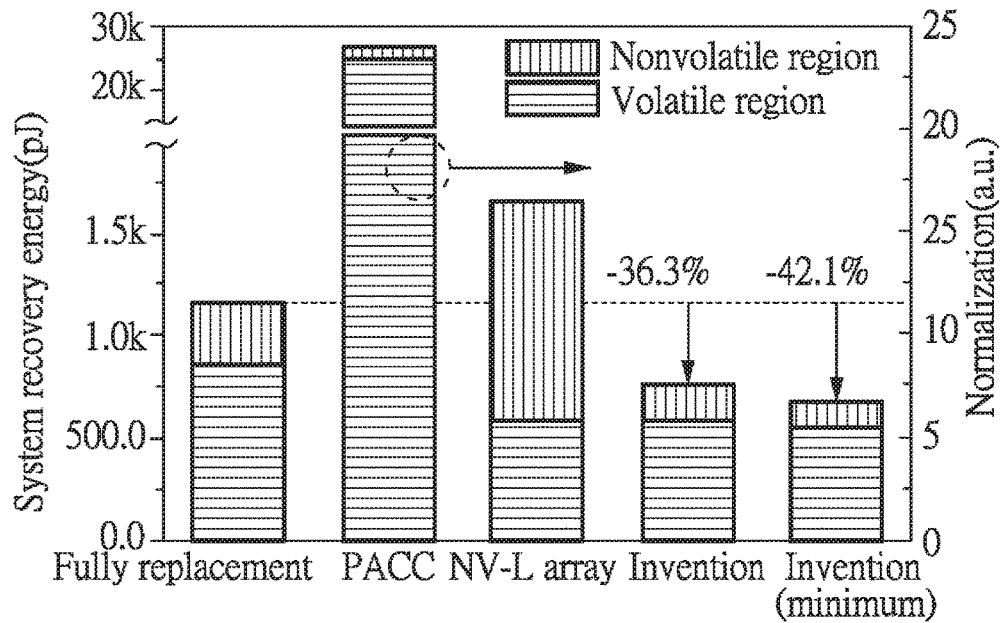
FIG. 12 is a schematic graph illustrating a simulation of the system restore energy consumption of the invention compared with the prior art.

FIG. 11 is a schematic graph illustrating a simulation of the system store energy consumption of the invention compared with the prior art. FIG. 12 is a schematic graph illustrating a simulation of the system recovery energy consumption of the invention compared with the prior art. The energy consumption is considered in two parts, one for the nonvolatile devices including 32 KB ReRAM and ReFF arrays and the other for volatile circuits. For simulating energy consumption for system store and restore operations, the cell-based design flow used by the simulator applies the Synoopsys PrimeTime PX power report in energy estimations, and the full customer design flow applies the Synoopsys Nanosim current report or information in energy estimations.

For analysis of the system store operation, the energy consumption of the system is essentially focused on the NV devices, so that the energy consumed in the NV regions is much more than that in the volatile regions for most implementations, as shown in FIG. 11. Thus, the result shows that the invention uses the SYSPA to directly reduce the used NVFF amount, so as to have a significant reduction in the energy consumption as compared with the fully replacement method in the NV regions, and the entire energy reduction is up to 21.4%. If the peripheral modules are not used, the amount of NVFF is further reduced by the SESERS mechanism, so that the energy consumption is reduced by about 53% as compared with the fully replacement method. The NVL array method belongs to the combination of the main memory level and flip-flop/register level implementations. Because of the feature in implementation level, the store energy consumption of the NVL array method is more than that of the fully replacement method. Furthermore, the energy consumption ratio of the volatile regions to the NV regions in the PACC method is different from that in other methods. That is, the PACC has energy consumption in the NV regions less than the other methods because the amount of NVFF for the store operation is relatively reduced after the data compression. However, such compression spends lots of time to access the internal FFs and registers that causes to consume additional energy on the volatile regions.

For analysis of the system recovery operation, the energy consumption in the NV regions is less than that in the volatile regions for most implementations because the states of the NV devices are not changed in recovery operation, as shown in FIG. 12. The inventive method has less restore energy consumption than the fully replacement method because the amount of NVFFs used in the recovery operation and FFs and the amount of registers used to change data in the normal operation are fewer in the invention, so that the restore energy consumption is certainly reduced on either the volatile regions or the NV regions. The invention uses the SYSPA to compare with the other methods to achieve at least 36.3% reduction in the restore energy consumption. The NVL array method needs longer time in the recovery operation due to the memory access operations for reading data and moving data to the system states, so as to consume more restore energy in the NV regions than that in the volatile regions. Compared with other implementations, the recovery energy of the NVL array method is large because of the NV memory circuits. For the PACC method, the energy consumption of the NV regions is relatively reduced because the NV circuits are provided to perform sensing only. However, the longer decompression time directly reflects that there is more restore energy consumption because the restore energy consumption of the volatile circuits for decompression computing is very large.

Figure 13:
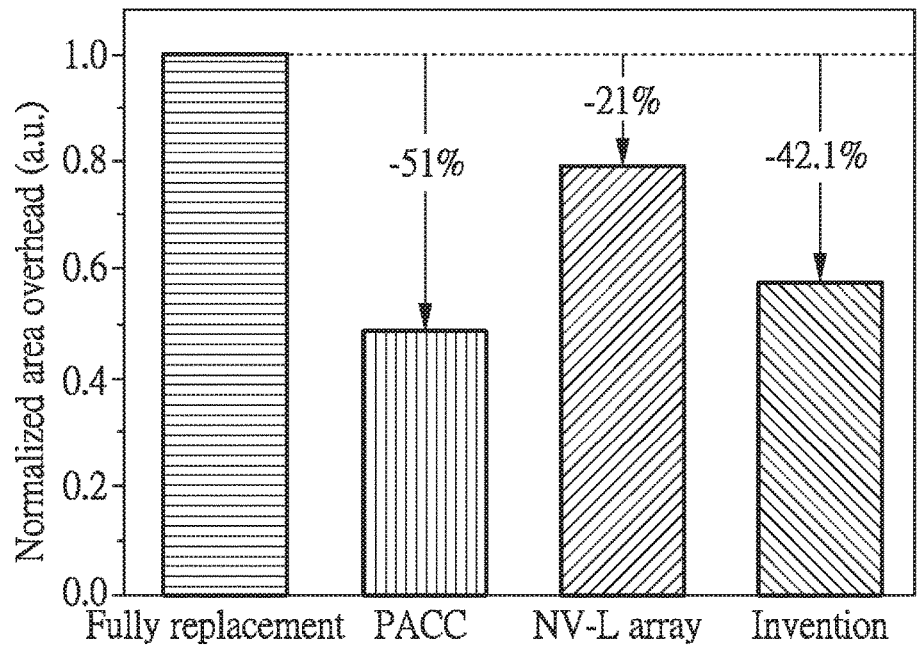
FIG. 13 is a schematic graph illustrating a simulation of the area overhead of the invention compared with a fully replacement method.

FIG. 13 is a schematic graph illustrating a simulation of the area overhead of the invention compared with a fully replacement method. For analysis of the area overhead, the nonvolatile microprocessors implemented by the cited methods and the compatible MSP430 microprocessor are compared to find their cell area differences. Hence, the area of digital and NV function blocks is analyzed by using the Synopsys Design Compiler to obtain gate level report and NV regions layout. As shown in FIG. 13, the fully replacement method belongs to the flip-flop/register level implementation and needs the most amount of resistive flip-flops than the other methods, so as to have the highest area overhead. The NVL array method stores the amount of system states as same as the fully replacement method, but its area overhead is 21% lower than the fully replacement method due to the NV interconnection sharing and memory array features of the combined main memory and flip-flop/register level implementation. The PACC method uses the data compression to relatively reduce the amount of used ReFFs, as well as the required additional area for hardware modules is small, so as to achieve a 51% area overhead reduction as compared with the fully replacement. The invention uses the system states partition (SYSPA) method to reduce the amount of stored system states and used ReFFs without using an additional hardware module, so as to have a 42% reduction on the area overhead as compared with the fully replacement method.

As shown in FIGS. 8, and 10 to 13, it is found that different nonvolatile microprocessor implementations have different performances on system store and restore time, energy consumption, and area overhead. For comparing the advantages and disadvantages of the implementations, a figure of merit (FOM) is required. For a nonvolatile microprocessor system, when a sum of the system store and restore time is getting smaller, the chance of switching to the power-off mode to save static power consumption is increased. The duration of the system restore time ($T_{restore}$) further makes an impact on the instant wake-up capability of the system. When the power for the system store and restore operation ($E_{store}$, $E_{restore}$) is getting lower, the idle time becomes shorter to reach the static power consumption, and the saved power is more than the total power consumed by the store and restore operation, so as to achieve the power-saving. The area overhead ($\hat{A}$) may directly influence the fabrication cost. As cited, the invention defines the figure of merit (FOM) to estimate the comprehensive grade of the nonvolatile microprocessor, which is known as a reciprocal of energy-delay-area product (REDAP), and is described as follows:

$$REDAP = \frac{1}{(E_{store} + E_{restore}) \cdot T_{restore} \cdot \hat{A}}. \quad (1)$$

Figure 14:
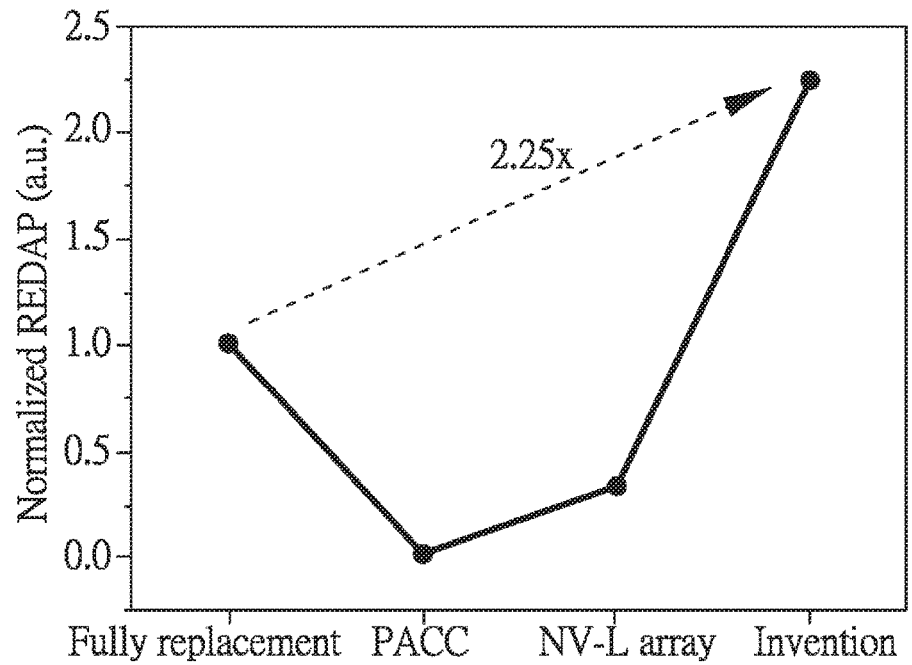
FIG. 14 is a schematic graph illustrating a figure of merit (reciprocal of energy-delay-area product, REDAP) comparison between the present invention and the prior art.

By taking the data of each of the implementation methods into equation (1), the reciprocal of energy-delay-area product (REDAP) can be computed. FIG. 14 is a schematic graph illustrating a figure of merit (reciprocal of energy-delay-area product, REDAP) comparison between the invention and the prior art. The REDAP is better if it is greater. As shown in FIG. 14, the invention has the best FOM among the other methods.

Figure 15:
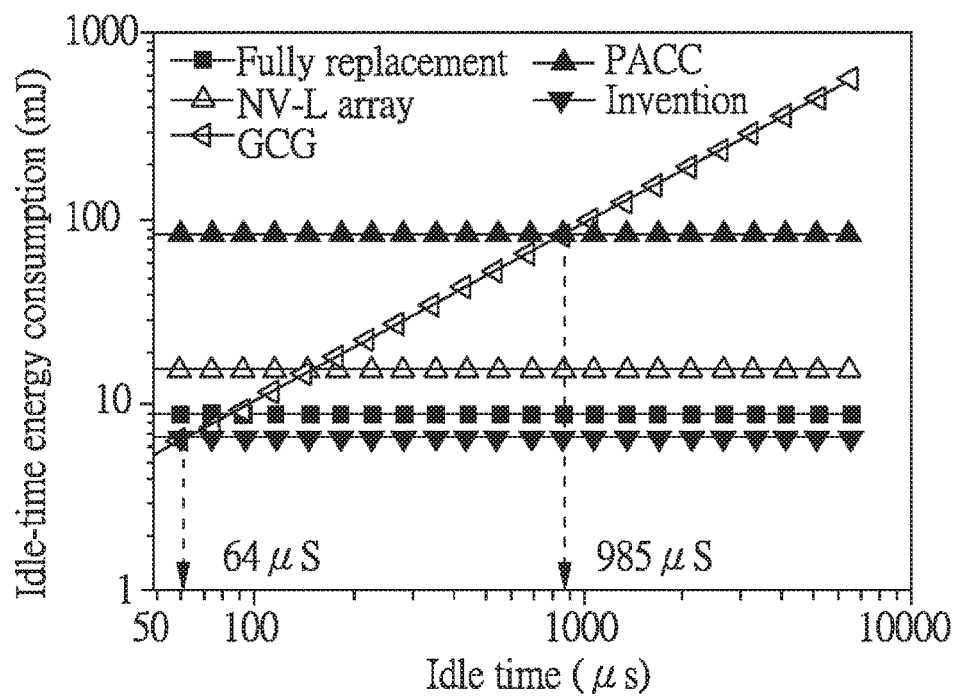
FIG. 15 is a schematic graph illustrating the energy consumption of the invention at idle as compared with the prior art.

FIG. 15 is a schematic graph illustrating the energy consumption of the invention at idle as compared with the prior art. In FIG. 15, the invention is compared with the prior arts and the low power technique of global clock gating (GCG) in idle-time energy consumption, in which the idle time is defined as a sum of active-to-standby transition time, system standby time and standby-to-active transition time, such that the idle-time power consumption is defined as a sum of active-to-standby transition power, system standby power and standby-to-active transition power.

Figure 16:
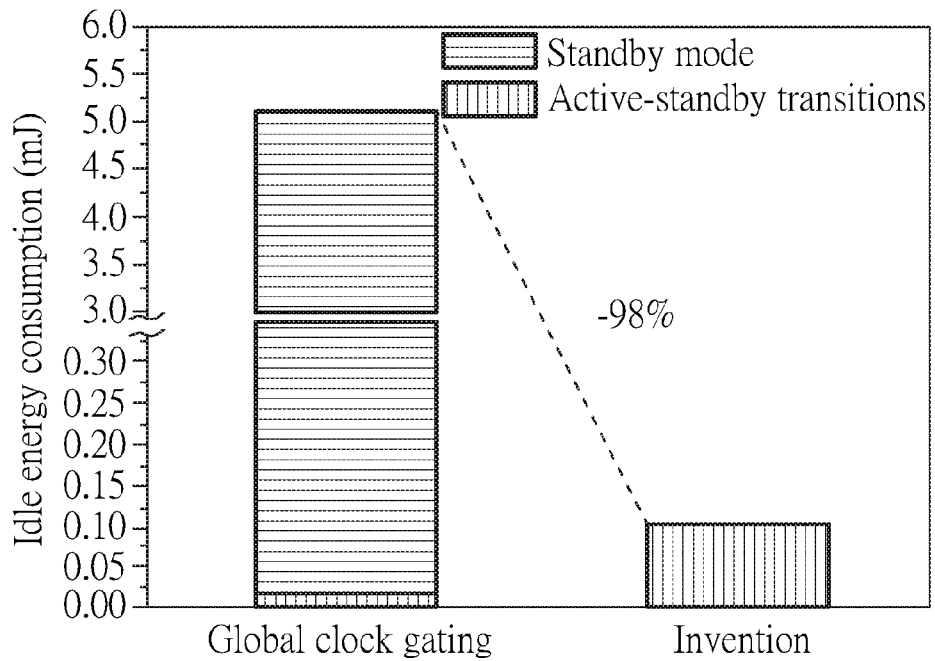
FIG. 16 is a schematic graph illustrating the energy consumption of the invention at idle as compared with a global clock gating (GCG) technique.

Various nonvolatile microprocessors are implemented with the low-power mode by power-off, so that the static energy consumption is estimated approximately to be 0 mW, which essentially consumes the active-to-standby and standby-to-active transition power. For the clock gating way, the system sleeping and wake-up time of microprocessors is close to that of the invention, and the operation power is lowered due to no operation of nonvolatile components. However, the static energy consumption cannot be completely avoided, so that it needs a certain standby power, and the global clock gating accumulates the standby power with the idle time growth. Therefore, the total of the idle energy consumption is greater than that of the nonvolatile microprocessors. As shown in FIG. 15, when the idle time exceeds 64 us, the invention has the idle energy consumption smaller than that of the global clock gating technique. Even the PACC nonvolatile microprocessors have a highest transition energy consumption, they still have a better energy consumption than those adopting the global clock gating after an idle time of 1ms. The normally-off computing (NoC) system is suitable for long-term idle applications, and hence biomedical detections are excellent applications. However, biomedical applications need a stable operation to compute and memorize data. This situation is suitable for use in ECG data compression. The nonvolatile microprocessors can be used in the BIOPAC MP150 instrument with a sample rate being 250 ECG signals per second. The test is performed for 60 seconds in total. The compatible MSP430 nonvolatile microprocessor (NV-uP) compresses ECG data using a running length coding and stores compressed data into the buffers. When the data is immediately over the buffer size, the stored data is transmitted to the host terminal through the UART interface. Because the ECG is a low-duty application, the time ratio of mode operations, observed as the standby mode versus the active mode, is about 58 times. FIG. 16 is a schematic graph illustrating the energy consumption of the invention at idle as compared with the global clock gating technique. As shown in FIG. 16, in comparison with the global clock gating technique, the invention can save the idle energy consumption by 98%.

Figure 17:
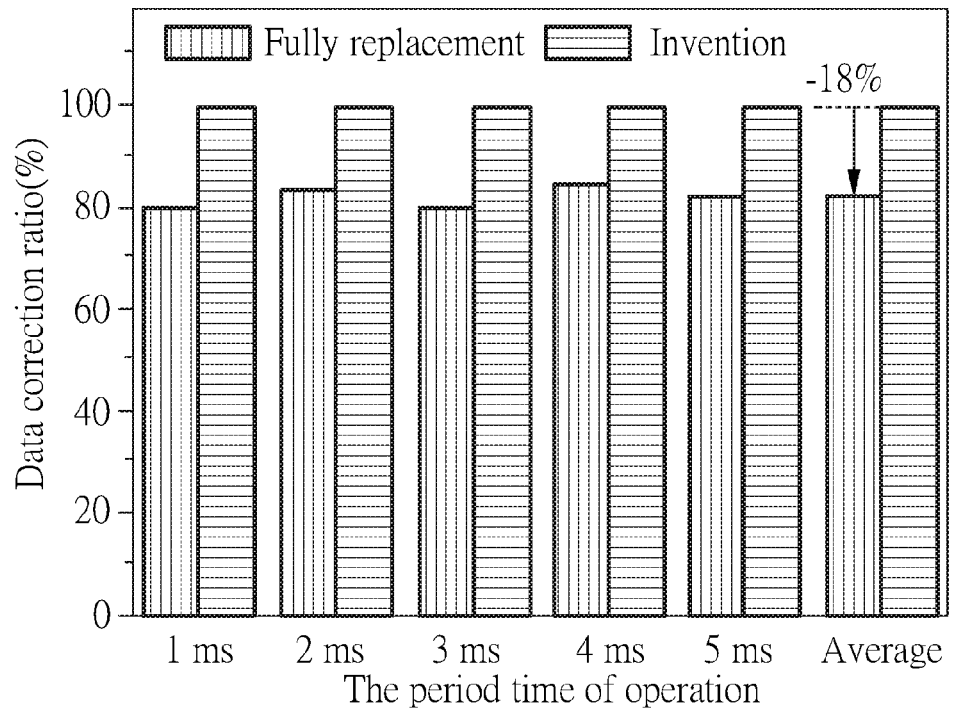
FIG. 17 is a schematic graph illustrating a data correction ratio of the invention compared with a fully replacement method as a system restore is operated for an ECG application.

The stable re-operation for the NV-uPs is regarded as one of important considerations. For the conventional NV-uP systems, as shown in FIG. 5(B), the communication between modules will not be in synchronization when the system power is off, so as to cause the system states recovery exceptions, resulting in that partial data transmission is not accurately completed and the data transmission reliability is reduced. FIG. 17 is a schematic graph illustrating a data correction ratio of the invention compared with a fully replacement method as a system recovery is operated for an ECG application, which inserts periodic power-off conditions in a simulation operation of 1 second. The periodic power-off conditions are operation periods of 1, 2, 3, 4, and 5 ins, each with the same standby time of 400 us. This can reveals the PREDEC influence. As shown in FIG. 17, the NV-uPs of the invention adopt the PREDEC technique to keep the complete data transmission accuracy as the power is periodically off. However, those of the fully replacement method without the PREDEC technique may cause an error probability of 18% in ECG data transmission on average. The prior arts directly restart at the position where the system states are stored, which are operated with low efficiency because of the unreliable recovery on the software part since it does not consider that the communication interface between the cooperated modules is not in synchronization and a time difference exists between the time recognized by the nonvolatile microprocessor and the actual time.

Figure 18:
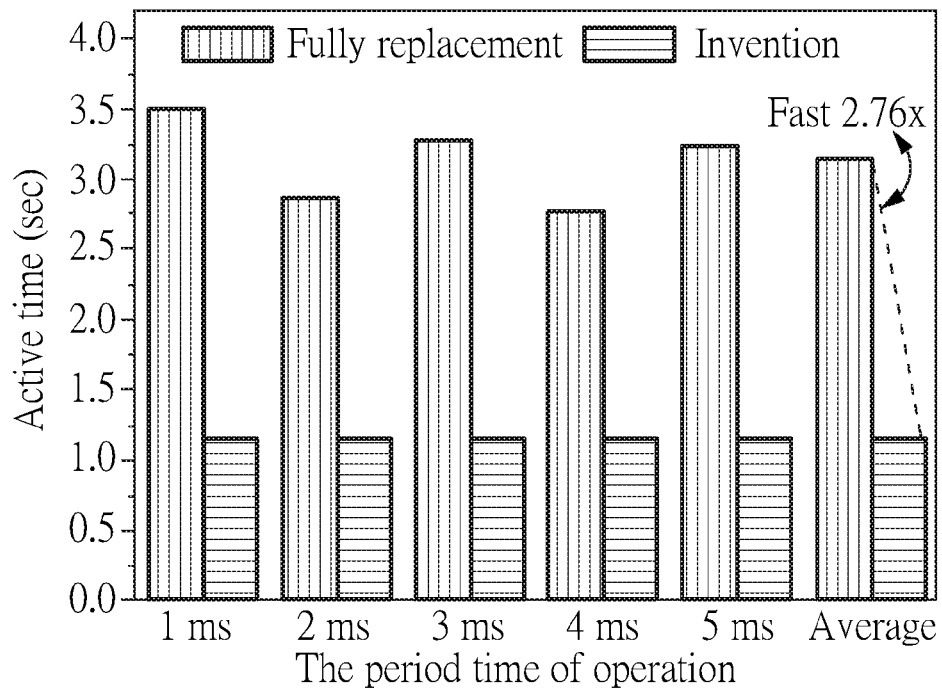
FIG. 18 is a schematic graph illustrating the active time of the invention compared with a fully replacement method for an ECG application.
Figure 19:
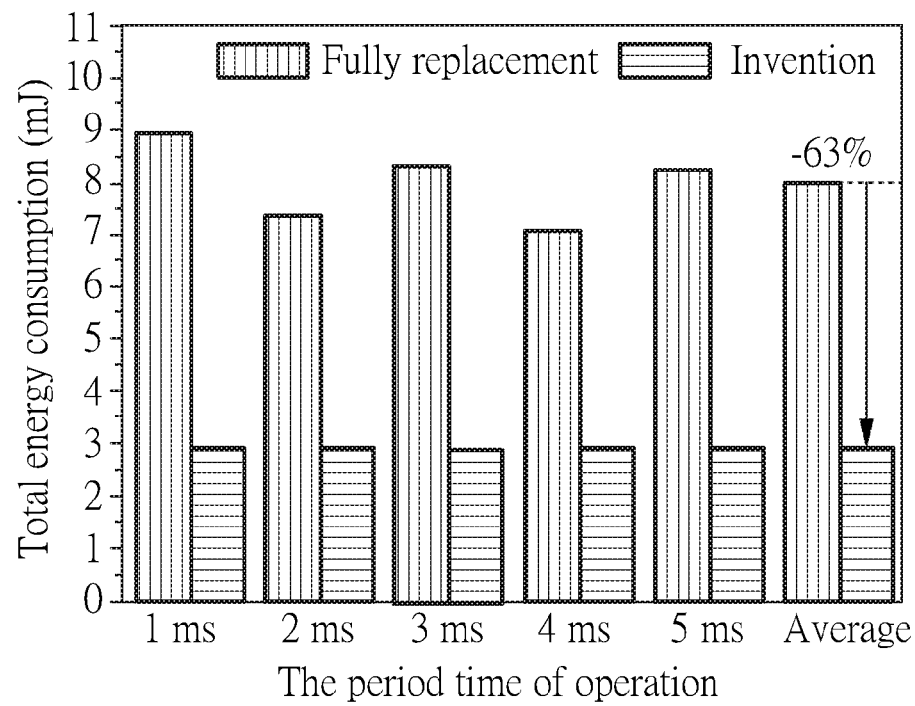
FIG. 19 is a schematic graph illustrating the total energy consumption of the invention compared with a fully replacement method for an ECG application.

However, in the biomedical applications, data loss may result in a severe consequence. Accordingly, the fully replacement method needs an additional software process to correct the data loss in the NV-uPs. One way is to use an echo correction. Namely, when a microprocessor transmits data to the host terminal through the UART interface, the host terminal returns an echo signal as same as the received data. Next, the microprocessor checks whether the received echo signal is as same as the transmitting data and, if yes, a next data is sent; otherwise the transmitting data is retransmitted. FIG. 18 is a schematic graph illustrating the active time of the invention compared with the fully replacement method for an ECG application. FIG. 19 is a schematic graph illustrating the total energy consumption of the invention compared with the fully replacement method for an ECG application. As shown in FIGS. 18 and 19, the power-off test is performed under operation periods of 1, 2, 3, 4, and 5 ms, each having the same standby time of 400 us, along with the echo correction used for the NV-uP in the fully replacement method. As shown in FIGS. 18 and 19, the echo correction can assure the data transmission accuracy but the additional procedure allows the NV-uP system in the fully replacement method to stay a 176% duration at the active mode more than the invention and to pay additional 163% of the total energy consumption.

As cited, the invention provides an energy-efficient nonvolatile microprocessor which uses the programmable restore entry decision (PREDEC) approach to dispose the expected handling process 330 at a fixed address so as to avoid the problem that the communication interfaces between the nonvolatile microprocessor and its cooperated modules are not in synchronization or a time difference exists between the time recognized by the nonvolatile microprocessor and the actual time. The energy-efficient nonvolatile microprocessor applies the system states partition (SYSPA) method to allow the processing core 105 to store only the programmer visible states in the nonvolatile flip-flop array 110 through the nonvolatile interconnections 115, thereby relatively saving the components and area of the array 110. The energy-efficient nonvolatile microprocessor is implemented with the selective store for eliminating redundant store (SESERS) mechanism. When power is off, the processing core 105 only stores the system states of peripheral modules corresponding to the bits of a store-enable register 106 that are set to be "true" into the nonvolatile flip-flop array 110, thereby further reducing the components and area of the array 110.

Although the present invention has been explained in relation to its preferred embodiment, it is to be understood that many other possible modifications and variations can be made without departing from the spirit and scope of the invention as hereinafter claimed.

What is claimed is:

1. An energy-efficient nonvolatile microprocessor, comprising:
    a processing core having a plurality of system states divided into programmer visible states and programmer invisible states;
    a nonvolatile flip-flop array for storing data, wherein the stored data is maintained after a power source is off; and
    a set of nonvolatile interconnections connected between the processing core and the nonvolatile flip-flop array, wherein the processing core only stores the programmer visible states into the nonvolatile flip-flop array through the nonvolatile interconnections when the power source is unstable, and the processing core includes a memory map having a reset entry and a system states recovery entry.

2. The energy-efficient nonvolatile microprocessor as claimed in claim 1, wherein the nonvolatile flip-flop array is a resistive nonvolatile flip-flop array or a nonvolatile flip-flop array comprised of other nonvolatile components.

3. The energy-efficient nonvolatile microprocessor as claimed in claim 2, wherein the processing core restores its programmer visible states, which are stored in the nonvolatile flip-flop array, when the power source is recovered to a stable state.

4. The energy-efficient nonvolatile microprocessor as claimed in claim 1, wherein the system states recovery entry is directed to an expected handling process.

5. The energy-efficient nonvolatile microprocessor as claimed in claim 4, wherein the processing core starts with the system states recovery entry to execute the expected handling process when the power source is recovered to a stable state, thereby overcoming different system states recovery exceptions generated by the microprocessor in different applications.

6. The energy-efficient nonvolatile microprocessor as claimed in claim 1, wherein the processing core starts with the reset entry to execute a complete booting process when the microprocessor is normally activated.

7. The energy-efficient nonvolatile microprocessor as claimed in claim 1, wherein the processing core includes a reset address identification which is an auto-vector.

8. The energy-efficient nonvolatile microprocessor as claimed in claim 1, further comprising a plurality of peripheral modules, such that the processing core has a store-enable register and each bit of the store-enable register is corresponding to one of the peripheral modules.

9. The energy-efficient nonvolatile microprocessor as claimed in claim 8, wherein the processing core only stores the system states of the peripheral modules corresponding to the bits of the store-enable register that are set to be "true" into the nonvolatile flip-flop array when the power source is unstable.

10. The energy-efficient nonvolatile microprocessor as claimed in claim 1, wherein the programmer visible states are the system states directly accessed by an instruction set of the processing core, and the system states include allocated arrays, peripheral registers configurations, register files, logged data, and system stacks.

11. The energy-efficient nonvolatile microprocessor as claimed in claim 1, wherein the programmer invisible states include limited state machines, internal buffers, and synchronizers.

12. An energy-efficient nonvolatile microprocessor having a processing core provided with a memory map including a reset entry and a system states recovery entry directed to an expected handling process, wherein, when a power source is recovered to a stable state, the processing core determines whether data of nonvolatile registers of communication interfaces is not transmitted before the power source is off, and starts with the system states recovery entry to execute the expected handling process, thereby overcoming different system states recovery exceptions generated by the microprocessor in different applications.

13. The energy-efficient nonvolatile microprocessor as claimed in claim 12, wherein the processing core starts with the reset entry to execute a complete booting process when the microprocessor is normally activated.

14. The energy-efficient nonvolatile microprocessor as claimed in claim 12, wherein the expected handling process is located at a fixed address of the memory map.

* * * * *